(12) United States Patent
Yamazaki

(10) Patent No.: US 9,490,179 B2
(45) Date of Patent: Nov. 8, 2016

(54) SEMICONDUCTOR ELEMENT AND SEMICONDUCTOR DEVICE

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 343 days.

(21) Appl. No.: 13/109,707

(22) Filed: May 17, 2011

(65) Prior Publication Data

US 2011/0284973 A1    Nov. 24, 2011

(30) Foreign Application Priority Data

May 21, 2010   (JP) ................. 2010-117831

(51) Int. Cl.
   *H01L 27/12*     (2006.01)
   *H01L 21/84*     (2006.01)
   *H01L 21/762*    (2006.01)

(52) U.S. Cl.
   CPC ......... *H01L 21/84* (2013.01); *H01L 21/76254* (2013.01); *H01L 27/1203* (2013.01)

(58) Field of Classification Search
   CPC .................................................. H01L 27/1214
   USPC ................................................ 257/411
   See application file for complete search history.

(56) References Cited

U.S. PATENT DOCUMENTS 6,407,435 B1 *  6/2002  Ma et al. ................ 257/411
6,621,114 B1    9/2003  Kim et al.
6,639,244 B1 * 10/2003  Yamazaki et al. ......... 257/72
6,963,090 B2   11/2005  Passlack et al.
7,253,061 B2    8/2007  Peng et al.
7,271,076 B2    9/2007  Yamazaki et al.
7,465,647 B2   12/2008  Yamazaki et al.
7,618,866 B2   11/2009  Luo et al.
7,667,277 B2    2/2010  Callegari et al.
7,906,780 B2    3/2011  Iwasaki (Continued)

FOREIGN PATENT DOCUMENTS

JP      06-177164 A     6/1994
JP    2001-320054 A    11/2001

(Continued)

OTHER PUBLICATIONS

Passlack.M et al., "Quasistatic and high frequency capacitance. voltage characterization of Ga2O3.GaAs structures fabricated by in situ molecular beam epitaxy", Appl. Phys. Lett. (Applied Physics Letters), 1996, vol. 68, No. 8, pp. 1099-1101.

(Continued)

*Primary Examiner* — Yu-Hsi D Sun
(74) *Attorney, Agent, or Firm* — Fish & Richardson P.C.

(57) ABSTRACT

One object is to provide a semiconductor element in which leakage current between a gate electrode and a channel formation region is suppressed even when the gate electrode is miniaturized as a result of miniaturization of the semiconductor element. Another object is to provide a downsized and high-performance semiconductor device. A semiconductor element having the following structure is manufactured: an insulating film containing gallium oxide and having a relative permittivity of 10 or more is formed as a gate insulating film over a semiconductor layer having a function of a channel formation region; and a gate electrode is formed over the gallium oxide. Further, a semiconductor device is manufactured by using the semiconductor element.

8 Claims, 10 Drawing Sheets

(56) References Cited

U.S. PATENT DOCUMENTS

| | | | |
|---|---|---|---|
| 7,960,798 B2 | 6/2011 | Luo et al. | |
| 8,288,237 B2 | 10/2012 | Callegari et al. | |
| 2004/0082130 A1* | 4/2004 | Suzuki et al. | 438/275 |
| 2005/0263835 A1* | 12/2005 | Sakama et al. | 257/411 |

FOREIGN PATENT DOCUMENTS

| | | |
|---|---|---|
| JP | 2005-203751 A | 7/2005 |
| JP | 2005-531136 | 10/2005 |
| JP | 2006-513572 | 4/2006 |
| JP | 2007-073698 A | 3/2007 |
| JP | 2007-201366 A | 8/2007 |
| JP | 2007-329477 A | 12/2007 |
| JP | 2008-530769 | 8/2008 |
| JP | 2008-205330 A | 9/2008 |
| JP | 2008-288405 A | 11/2008 |
| JP | 2009-224737 A | 10/2009 |
| WO | WO-03/100835 | 12/2003 |
| WO | WO-2004/064172 | 7/2004 |
| WO | WO-2006/076086 | 7/2006 |
| WO | WO-2007/086291 | 8/2007 |

OTHER PUBLICATIONS

Lee.S et al., "Dielectric characterization of transparent epitaxial Ga2O3 thin film on n-GaN/Al2O3 prepared by pulsed laser deposition", Appl. Phys. Lett. (Applied Physics Letters), Nov. 1, 2006, vol. 89, No. 18, pp. 182906-1-182906-3.

* cited by examiner

SEMICONDUCTOR ELEMENT AND SEMICONDUCTOR DEVICE

BACKGROUND OF THE INVENTION

1. Field of the Invention

The present invention relates to a semiconductor element provided with an insulating film and a semiconductor device including the semiconductor element.

2. Description of the Related Art

In recent years, techniques for downsizing semiconductor devices and those for higher performance of semiconductor devices have attracted considerable attention. Accordingly, there is a growing demand for miniaturization of semiconductor elements formed in such semiconductor devices and higher integration of semiconductor elements which is necessary for miniaturization.

What is important for miniaturization of a semiconductor element provided with an insulating film is miniaturization of a wiring and an electrode which are formed in the element. For example, one important point for miniaturization of a semiconductor element is miniaturization of a gate electrode of a transistor that is one mode of a semiconductor element. As an example of a technique for miniaturizing a gate electrode, a devised processing method at the time of forming a gate electrode has been disclosed (Patent Document 1).

REFERENCE

Patent Document

[Patent Document 1] Japanese Published Patent Application No. H6-177164

SUMMARY OF THE INVENTION

However, as higher integration is realized by miniaturizing a semiconductor element by the technique disclosed in Patent Document 1, lower voltage is applied on each semiconductor element and a weaker electric field is this applied on a channel formation region. Accordingly, carriers do not easily flow in a channel portion, which may prevent operation of the semiconductor element. Therefore, capacitance which enables a flow of a large number of carriers in the channel portion enough to operate the semiconductor element needs to be secured in the semiconductor element.

Thus, in order that the gate electrode be miniaturized with capacitance necessary for operation of the semiconductor element secured, a gate insulating film which is formed between the gate electrode and the channel formation region needs to be reduced in thickness.

Since relative permittivity of a silicon oxide based insulating film (e.g., $SiO_2$) which is generally used as a gate insulating material is as low as approximately 3.9, a gate insulating film needs to be reduced in thickness in order that the size of the gate electrode be reduced with capacitance necessary for operation of the semiconductor element secured.

However, when the thickness of a silicon oxide based insulating film is reduced to several nanometers, an unignorable amount of leakage current flows between the gate electrode and the channel formation region and operation of the transistor is adversely affected.

The present invention is made in view of the foregoing technical background. Therefore, one object of one embodiment of the present invention is to provide a downsized semiconductor element by reducing leakage current between a gate electrode and a channel formation region.

Further, one object of one embodiment of the present invention is to provide a downsized semiconductor device which uses such a semiconductor element.

In order to achieve at least one of the above objects, one embodiment of the present invention focuses on gallium oxide which has higher relative permittivity than silicon oxide based insulating materials. By using an insulating film containing gallium oxide and having a relative permittivity of 10 or more as a gate insulating film, necessary capacitance for operation of a semiconductor element can be secured even when the thickness of the gate insulating film is increased. As a result, the gate electrode can be miniaturized with leakage current between the gate electrode and the channel formation region suppressed.

In view of the above, one embodiment of the present invention is a semiconductor element including the following components: a single crystal semiconductor substrate provided with a source region, a drain region, and a channel formation region between the source region and the drain region into which an impurity element imparting one conductivity type is added; a gate insulating film containing gallium oxide and being in contact with the single crystal semiconductor substrate; a gate electrode overlapping with the channel formation region and being in contact with the gate insulating film containing gallium oxide; a source electrode electrically connected to the source region through a first opening portion which is formed in the gate insulating film containing gallium oxide; and a drain electrode electrically connected to the drain region through a second opening portion which is formed in the gate insulating film containing gallium oxide. In the above semiconductor element, the gate insulating film containing gallium oxide has a relative permittivity of 10 or more.

Note that the gate insulating film containing gallium oxide refers to a film in which the concentration of gallium is 35 at. % to 50 at. % and the concentration of oxygen is 50 at. % to 65 at. %, where the total atomic percentage of gallium and oxygen is 100 at. %. The gate insulating film may be either a single-layer film of gallium oxide or a stacked-layer film of a gallium oxide film and a different kind of insulating film (e.g., a silicon oxide film).

Note also that in the case where an element other than gallium and oxygen is contained in the gate insulating film containing gallium oxide, the total atomic percentage of gallium, oxygen, and impurity elements is 100 at. %.

According to the above embodiment of the present invention, leakage current between the gate electrode and the channel formation region can be suppressed even when the gate electrode is miniaturized; therefore, a downsized semiconductor element can be provided.

Another embodiment of the present invention is a semiconductor element including the following components: a single crystal semiconductor substrate provided with a source region, a drain region, and a channel formation region between the source region and the drain region into which an impurity element imparting one conductivity type is added in a plurality of regions electrically separated from each other by an oxide film; a gate insulating film containing gallium oxide and being in contact with the single crystal semiconductor substrate; a gate electrode overlapping with the channel formation region and being in contact with the gate insulating film containing gallium oxide; a source electrode electrically connected to the source region through a first opening portion which is formed in the gate insulating film containing gallium oxide; and a drain electrode electrically connected to the drain region through a second opening portion which is formed in the gate insulating film containing gallium oxide. In the above semiconductor element, the gate insulating film containing gallium oxide has a relative permittivity of 10 or more.

Note that the gate insulating film containing gallium oxide refers to a film in which the concentration of gallium is 35 at. % to 50 at. % and the concentration of oxygen is 50 at. % to 65 at. %, where the total atomic percentage of gallium and oxygen is 100 at. %. The gate insulating film may be either a single-layer film of gallium oxide or a stacked-layer film of a gallium oxide film and a different kind of insulating film (e.g., a silicon oxide film).

Note also that in the case where an element other than gallium and oxygen is contained in the gate insulating film containing gallium oxide, the total atomic percentage of gallium, oxygen, and impurity elements is 100 at. %.

According to the above embodiment of the present invention, leakage current between the gate electrode and the channel formation region can be suppressed, whereby a semiconductor element can be downsized. In addition, a semiconductor device can be provided in which, over one substrate, a plurality of downsized semiconductor elements is provided in a plurality of regions separated from each other by an oxide film.

Another embodiment of the present invention is a semiconductor element including the following components: a plurality of single crystal semiconductor layers formed over a substrate with an insulating film provided therebetween and provided with a source region, a drain region, and a channel formation region between the source region and the drain region into which an impurity element imparting one conductivity type is added; a gate insulating film containing gallium oxide and being in contact with the plurality of single crystal semiconductor layers; a gate electrode overlapping with the channel formation region and being in contact with the gate insulating film containing gallium oxide; a source electrode electrically connected to the source region through a first opening portion which is formed in the gate insulating film containing gallium oxide; and a drain electrode electrically connected to the drain region through a second opening portion which is formed in the gate insulating film containing gallium oxide. In the above semiconductor element, the gate insulating film containing gallium oxide has a relative permittivity of 10 or more.

Note that the gate insulating film containing gallium oxide refers to a film in which the concentration of gallium is 35 at. % to 50 at. % and the concentration of oxygen is 50 at. % to 65 at. %, where the total atomic percentage of gallium and oxygen is 100 at. %. The gate insulating film may be either a single-layer film of gallium oxide or a stacked-layer film of a gallium oxide film and a different kind of insulating film (e.g., a silicon oxide film).

Note also that in the case where an element other than gallium and oxygen is contained in the gate insulating film containing gallium oxide, the total atomic percentage of gallium, oxygen, and impurity elements is 100 at. %.

According to the above embodiment of the present invention, leakage current between the gate electrode and the channel formation region can be suppressed, whereby a downsized semiconductor element can be provided.

Further, according to the above embodiment of the present invention, microfabrication is possible because the single crystal semiconductor layer provided over the insulating film is ultrathin. As a result, a further downsized semiconductor element can be provided.

Besides, according to the above embodiment of the present invention, a highly integrated semiconductor device in which a space between the semiconductor elements is reduced can be provided because the semiconductor elements are separated from each other.

Another embodiment of the present invention is a semiconductor element including the following components: a plurality of single crystal semiconductor layers which is physically separated from each other, formed over a single crystal semiconductor substrate with an insulating film provided therebetween, and provided with a source region, a drain region, and a channel formation region between the source region and the drain region into which an impurity element imparting one conductivity type is added; a gate insulating film containing gallium oxide and being in contact with the plurality of single crystal semiconductor layers; a gate electrode overlapping with the channel formation region and being in contact with the gate insulating film containing gallium oxide; a source electrode electrically connected to the source region through a first opening portion which is formed in the gate insulating film containing gallium oxide; and a drain electrode electrically connected to the drain region through a second opening portion which is formed in the gate insulating film containing gallium oxide. In the above semiconductor element, the gate insulating film containing gallium oxide has a relative permittivity of 10 or more.

Note that the gate insulating film containing gallium oxide refers to a film in which the concentration of gallium is 35 at. % to 50 at. % and the concentration of oxygen is 50 at. % to 65 at. %, where the total atomic percentage of gallium and oxygen is 100 at. %. The gate insulating film may be either a single-layer film of gallium oxide or a stacked-layer film of a gallium oxide film and a different kind of insulating film (e.g., a silicon oxide film).

Note also that in the case where an element other than gallium and oxygen is contained in the gate insulating film containing gallium oxide, the total atomic percentage of gallium, oxygen, and impurity elements is 100 at. %.

According to the above embodiment of the present invention, leakage Current between the gate electrode and the channel formation region can be suppressed, whereby a downsized semiconductor element can be provided.

Further, according to the above embodiment of the present invention, microfabrication is possible because the single crystal semiconductor layer provided over the insulating film is ultrathin. As a result, a further downsized semiconductor element can be provided.

Besides, according to the above embodiment of the present invention, a highly integrated semiconductor device in which a space between the semiconductor elements is reduced can be provided because the semiconductor elements are separated from each other.

In addition, according to the above embodiment of the present invention, high-accuracy processing is possible because the single crystal semiconductor layers formed over the single crystal semiconductor substrate are separated from each other, and a further downsized semiconductor element can be provided.

Another embodiment of the present invention is a semiconductor element including the following components: a plurality of single crystal semiconductor layers which is physically separated from each other, formed over an insulating substrate with an insulating film provided therebetween, and provided with a source region, a drain region, and a channel formation region between the source region and the drain region into which an impurity element imparting one conductivity type is added; a gate insulating film containing gallium oxide and being in contact with the plurality of single crystal semiconductor layers; a gate electrode overlapping with the channel formation region and being in contact with the gate insulating film containing gallium oxide; a source electrode electrically connected to the source region through a first opening portion which is formed in the gate insulating film containing gallium oxide; and a drain electrode electrically connected to the drain region through a second opening portion which is formed in the gate insulating film containing gallium oxide. In the above semiconductor element, the gate insulating film containing gallium oxide has a relative permittivity of 10 or more.

Note that the gate insulating film containing gallium oxide refers to a film in which the concentration of gallium is 35 at. % to 50 at. % and the concentration of oxygen is 50 at. % to 65 at. %, where the total atomic percentage of gallium and oxygen is 100 at. %. The gate insulating film may be either a single-layer film of gallium oxide or a stacked-layer film of a gallium oxide film and a different kind of insulating film (e.g., a silicon oxide film).

Note also that in the case where an element other than gallium and oxygen is contained in the gate insulating film containing gallium oxide, the total atomic percentage of gallium, oxygen, and impurity elements is 100 at. %.

According to the above embodiment of the present invention, leakage current between the gate electrode and the channel formation region can be suppressed, whereby a downsized semiconductor element can be provided.

Further, according to the above embodiment of the present invention, microfabrication is possible because the single crystal semiconductor layer provided over the insulating film is ultrathin. As a result, a further downsized semiconductor element can be provided.

Besides, according to the above embodiment of the present invention, a highly integrated semiconductor device in which a space between the semiconductor elements is reduced can be provided because the semiconductor elements are separated from each other.

Further, according to the above embodiment of the present invention, semiconductor elements can be formed over a large-size substrate which is used in a liquid crystal display device or the like, whereby provision of semiconductor elements at low cost is possible.

Another embodiment of the present invention is a semiconductor device including the semiconductor element having any of the above-described structures.

According to the above embodiment of the present invention, a downsized semiconductor device including a downsized semiconductor element can be provided.

Note that in this specification, the term "gallium oxide" means that oxygen and gallium are included as components and is not limited to a state as gallium oxide unless otherwise specified. For example, "an insulating film containing gallium oxide" can be regarded as "an insulating film containing oxygen and gallium."

Note that in this specification and the like, the term "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term "electrode" or "wiring" does not limit a function of a component. For example, an "electrode" is sometimes used as part of a "wiring", and vice versa. Further, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

According to one embodiment of the present invention, a downsized semiconductor element can be provided. Further, a downsized semiconductor device in which downsized semiconductor elements are integrated can be provided.

DETAILED DESCRIPTION OF THE INVENTION

Figure 1:
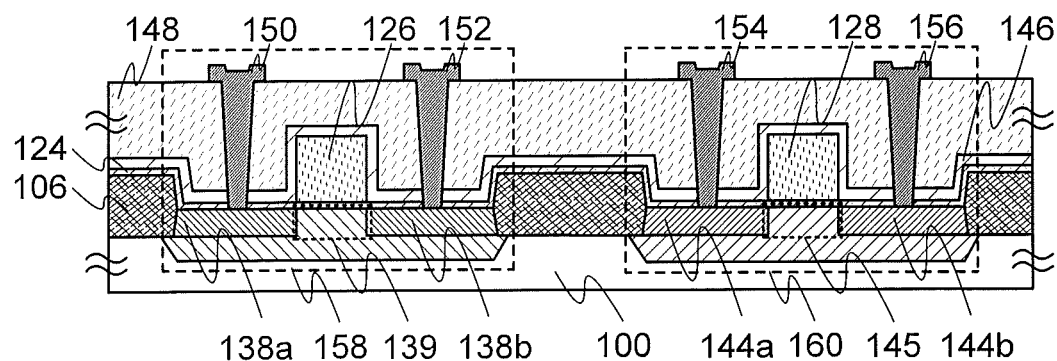
FIG. 1 is a diagram illustrating an embodiment of a semiconductor device.

Embodiments of the present invention will be described below with reference to the accompanying drawings. However, the present invention is not limited to the description below, and it is easily understood by those skilled in the art that modes and details disclosed herein can be modified in various ways without departing from the spirit and scope of the present invention. Therefore, the present invention should not be interpreted as being limited to the description in the embodiments below. Note that in the structures of the present invention which are described below, the same portions or portions having similar functions are denoted by the same reference numerals in different drawings, and explanation thereof will not be repeated.

(Embodiment 1)

In this embodiment, a structure and a manufacturing method of a semiconductor device which includes a semiconductor element according to one embodiment of the disclosed invention will be described with reference to FIG. 1, FIGS. 2A to 2F, and FIGS. 3A to 3D.

Specifically, as an example of a semiconductor element according to one embodiment of the present invention, a field effect transistor (FET) in which an insulating film containing gallium oxide and having a relative permittivity of 10 or more is used as a gate insulating film is described.

More specifically, a semiconductor device in which a plurality of the semiconductor elements is provided over one substrate is described.

<Example of Structure of Semiconductor Device>

In the cross-sectional view of FIG. 1, a top-gate complementary metal oxide semiconductor (CMOS) element including an n-channel FET and a p-channel FET which is formed using a single crystal semiconductor substrate is illustrated as an example of a structure of a semiconductor device according to one embodiment of the disclosed invention.

In the CMOS element illustrated in FIG. 1, an n-channel FET 158 and a p-channel FET 160 which are adjacent to each other and separated from each other by an oxide film 106 are formed. Each of the FETs is provided with a source region, a drain region, and a channel formation region in a single crystal semiconductor substrate.

The n-channel FET 158 in FIG. 1 has the following structure in a region separated by the oxide film 106: a source region 138a, a drain region 138b, and a channel formation region 139 are formed in a single crystal semiconductor substrate 100; a gate insulating film 124 containing gallium oxide is formed over the single crystal semiconductor substrate 100; a gate electrode 126 is formed in a region overlapping with the channel formation region 139 with the gate insulating film 124 containing gallium oxide provided therebetween; a first interlayer insulating film 146 and a second interlayer insulating film 148 are formed over the gate electrode 126 and the gate insulating film 124 containing gallium oxide; and a source electrode 150 and a drain electrode 152 are formed so as to be electrically connected to the source region 138a and the drain region 138b, respectively, through opening portions provided in the gate insulating film 124 containing gallium oxide, the first interlayer insulating film 146, and the second interlayer insulating film 148.

The p-channel FET 160 in FIG. 1 has the following structure in a region separated by the oxide film 106: a source region 144a, a drain region 144b, and a channel formation region 145 are formed in the single crystal semiconductor substrate 100; the gate insulating film 124 containing gallium oxide is formed over the single crystal semiconductor substrate 100; a gate electrode 128 is formed in a region overlapping with the channel formation region 145 with the gate insulating film 124 containing gallium oxide provided therebetween; the first interlayer insulating film 146 and the second interlayer insulating film 148 are formed over the gate electrode 128 and the gate insulating film 124 containing gallium oxide; and a source electrode 154 and a drain electrode 156 are formed so as to be electrically connected to the source region 144a and the drain region 144b, respectively, through opening portions provided in the gate insulating film 124 containing gallium oxide, the first interlayer insulating film 146, and the second interlayer insulating film 148.

Although the gate insulating film 124 is illustrated as having a single-layer structure in FIG. 1, the gate insulating film 124 may have a stacked-layer structure including a plurality of layers.

Although the gate electrodes 126 and 128 are each illustrated as having a single-layer structure in FIG. 1, each of them may have a stacked-layer structure including a plurality of layers.

Although the interlayer film over the gate electrodes is illustrated as having a stacked-layer structure including the first interlayer insulating film and the second interlayer insulating film in FIG. 1, the interlayer film may have a single-layer structure.

Since the n-channel and p-channel FETs in the example of this embodiment include an insulating film containing gallium oxide and having a relative permittivity of 10 or more as the gate insulating film, necessary capacitance for operation of the semiconductor element can be secured even when the thickness of the gate insulating film is increased. As a result, in each of the FETs, the gate electrode can be miniaturized with leakage current between the gate electrode and the channel formation region suppressed, whereby downsized FETs can be provided.

Further, the downsized n-channel FET and the downsized p-channel FET are integrated over one substrate, whereby the CMOS element can be downsized.

<Manufacturing Method of Semiconductor Device>

Next, an example of a manufacturing method of the semiconductor device will be described with reference to FIGS. 2A to 2F and FIGS. 3A to 3D.

First, the single crystal semiconductor substrate 100 is prepared, and by any of local oxidation of silicon (LOCOS) and shallow trench isolation (STI) that are known techniques, a plurality of element formation regions which is separated by an oxide film is formed in the single crystal semiconductor substrate.

In this embodiment, formation of a first element formation region 108 and a second element formation region 110 by LOCOS is specifically described.

Figure 2A:
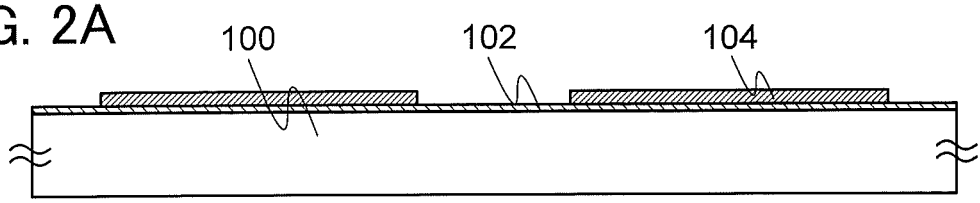
FIGS. 2A to 2F are diagrams illustrating an embodiment of a semiconductor device.

First, over the single crystal semiconductor substrate 100, a protective film 102 for reducing distortion which occurs in the single crystal semiconductor substrate 100 due to heat in a later step, and a mask film 104 for selective formation of an oxide film to separate the n-channel FET and the p-channel FET which is formed in a later step are formed (see FIG. 2A).

As the single crystal semiconductor substrate 100, for example, a silicon (Si) substrate, a gallium arsenide (GaAs) substrate, an indium phosphide (InP) substrate, or the like can be used.

For example, a silicon oxide film or the like can be used as the protective film 102 and a silicon nitride film or the like can be used as the mask film 104.

In the description of this embodiment, the single crystal semiconductor substrate 100 is a single crystal p-type silicon substrate.

Figure 2B:
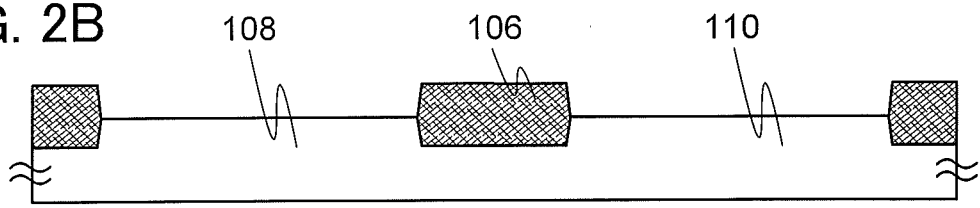

Then, the oxide film 106 which separates the n-channel FET and the p-channel FET from each other is formed with the use of the mask film 104 as a mask; the mask film 104 is removed using a chemical solution such as hot phosphoric acid and the protective film 102 is removed using a chemical solution such as a hydrofluoric acid; accordingly, the first element formation region 108 and the second element formation region 110 which are separated from each other by the oxide film 106 are formed (see FIG. 2B).

Note that, for example, a silicon oxide film formed by a heat oxidation method can be used as the oxide film 106.

By separating the FETs from each other by the oxide film 106, leakage current between the FETs can be suppressed, whereby a plurality of FETs can be integrated over one substrate.

Figure 2C:
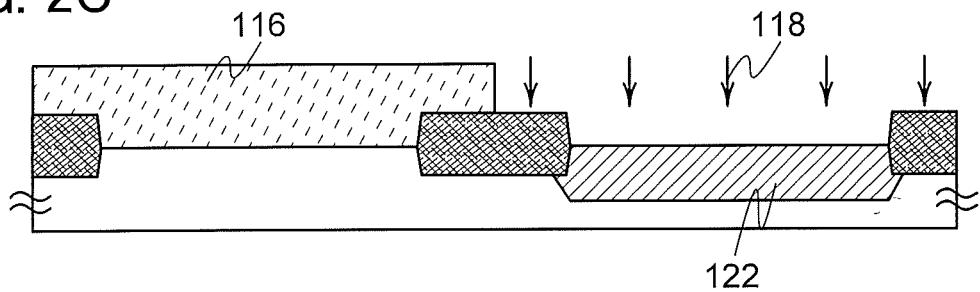

After that, with the first element formation region 108 covered with a resist 116, an impurity element 118 imparting n-type conductivity is added to the second element formation region 110 where the p-channel FET is formed later, whereby an n-well 122 is formed (see FIG. 2C).

In this embodiment, phosphorus (P) is used as the impurity element imparting n-type conductivity and phosphine ($PH_3$) is used as a doping gas containing the impurity element.

Figure 2D:
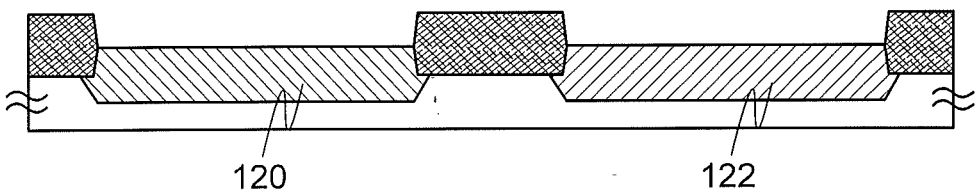

In a similar manner, a p-well 120 is formed in the first element formation region 108 where the n-channel FET is formed later (see FIG. 2D).

Note that although the p-well is formed by addition of the impurity element, the impurity element is not necessarily added if operation of the n-channel FET which is formed in the later step is realized without addition of the impurity element.

Figure 2E:
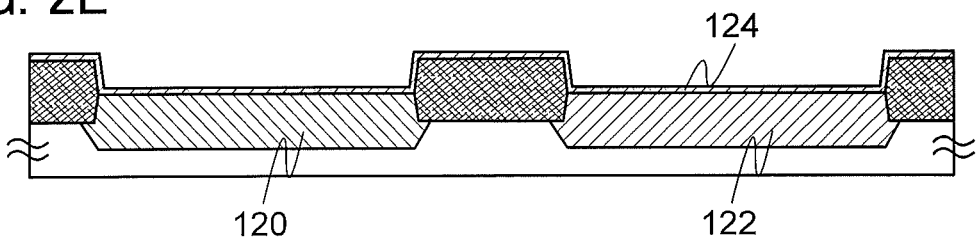
Figure 2F:
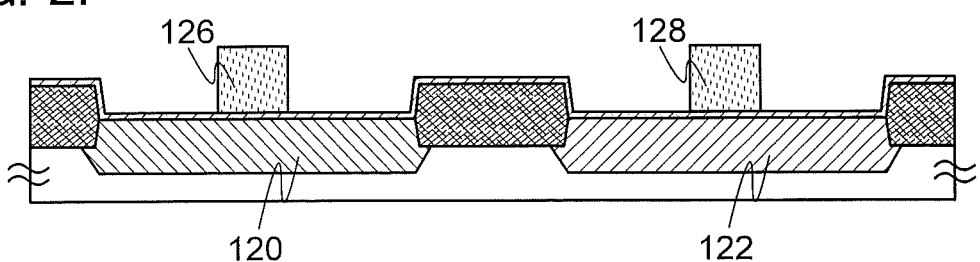

Then, the gate insulating film 124 containing gallium oxide and having a relative permittivity of 10 or more is formed so as to cover the p-well 120 and the n-well 122 (see FIG. 2E).

Note that when the thickness of the gate insulating film 124 containing gallium oxide is too small, leakage current which adversely affects operation of the semiconductor element occurs; on the other hand, when the thickness of the gate insulating film 124 containing gallium oxide is too large, a large number of carriers enough to operate the semiconductor element does not flow. The thickness of the gate insulating film 124 is preferably greater than or equal to 1 nm and less than or equal to 50 nm, further preferably greater than or equal to 1 nm and less than or equal to 20 nm.

The gate insulating film 124 containing gallium oxide which is used here can be formed by a sputtering method or a chemical vapor deposition (CVD) method, for example.

For example, the gate insulating film 124 containing gallium oxide and having a relative permittivity of 10 or more can be obtained by performing deposition treatment by a high-frequency sputtering method and then performing heat treatment at 350° C. for one hour. The conditions of the deposition treatment are as follows: $Ga_2O_3$ that is an insulating target and a substrate over which gallium oxide is to be deposited are placed with a distance therebetween being 110 mm in a sputtering apparatus; the substrate temperature is kept at room temperature; an argon gas at 10.5 sccm and an oxygen gas at 4.5 sccm keep being supplied; the pressure inside the apparatus is kept at 0.4 Pa; and a high-frequency voltage of 200 W is applied on the $Ga_2O_3$ target and the substrate.

The gate insulating film 124 containing gallium oxide which is thus obtained under the above-described conditions has a relative permittivity of 13.8, for example, which sufficiently satisfies relative permittivity necessary for the gate insulating film in this specification.

Note that, in the gallium oxide film which is formed as a gate insulating film by the formation method described in this embodiment, a substance other than gallium and oxygen may be contained. For example, a gallium oxide film containing an element such as silicon (Si), germanium (Ge), tin (Sn), aluminum (Al), or indium (In) or a gallium oxide film containing a gas component such as Ar which is used at the time of depositing gallium oxide may be formed.

Further, although the gate insulating film in this embodiment has a single-layer structure, the gate insulating film may have a stacked-layer structure in which a thin insulating film such as a thin silicon oxide film is formed at one or both of an interface between the channel formation region and the gate insulating film and an interface between the gate insulating film and the gate electrode.

Then, a polysilicon layer for formation of the gate electrodes is formed over an entire surface of the substrate and is shaped into a predetermined form by a lithography technique and a dry etching technique. By this treatment, the gate electrode 126 and the gate electrode 128 are formed over the gate insulating film 124 containing gallium oxide (see FIG. 2F).

Note that the gate electrode 126 and the gate electrode 128 may be doped with an n-type impurity such as phosphorus (P) for a reduction in resistance. It may be at the time of formation of the polysilicon layer that an n-type impurity such as phosphorus is added.

In this embodiment, an example in which the polysilicon layer having a single-layer structure is used as the gate electrode is described; however, the present invention is not limited thereto and the gate electrode may have a single-layer structure of a silicide layer or a polycide structure in which a polysilicon layer and a silicide layer are stacked. Alternatively, the gate electrode may have a single-layer structure or a stacked-layer structure of metal or a material whose main component is metal.

Note that a layer containing silicon and a layer containing gallium oxide can be provided so as to be in direct contact with each other.

Then, ions are implanted to the single crystal semiconductor substrate in order to form the source region and the drain region. Since the CMOS element is formed in this embodiment, a region where the n-well 122 is formed and the p-channel FET is to be formed is covered with a resist 134; an impurity element 136 imparting n-type conductivity is added to a region where the p-well 120 is formed, whereby the source region 138a and the drain region 138b are formed (see FIG. 3A).

In this embodiment, phosphorus (P) is used as the impurity element imparting n-type conductivity and $PH_3$ is used as a doping gas containing the impurity element.

Figure 3A:
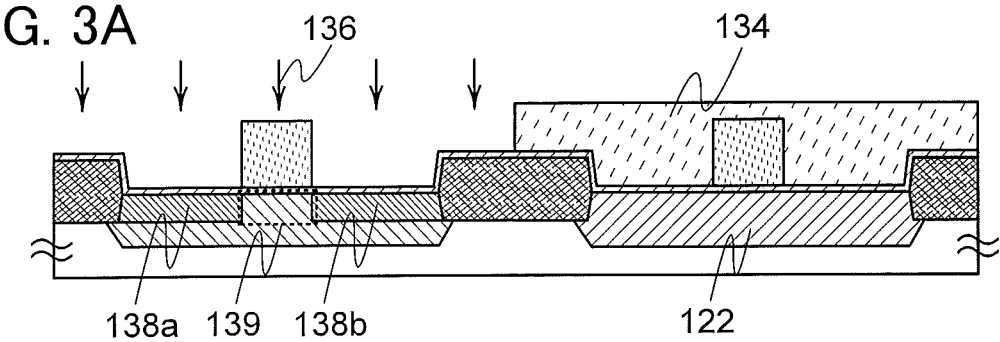
FIGS. 3A to 3D are diagrams illustrating an embodiment of a semiconductor device.

Note that the p-well between the source region 138a and the drain region 138b functions as the channel formation region 139 (see FIG. 3A).

Figure 3B:
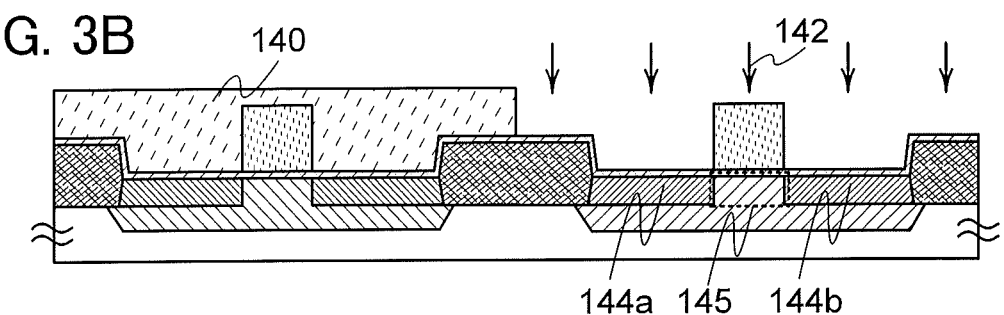

After that, the resist 134 is removed and a region where the p-well 120 is formed and the n-channel FET is to be formed is covered with a resist 140; an impurity element 142 imparting p-type conductivity is added to a region where the n-well 122 is formed, whereby the source region 144a and the drain region 144b are formed (see FIG. 3B).

In this embodiment, boron (B) is used as the impurity element imparting p-type conductivity and diborane ($B_2H_6$) is used as a doping gas containing the impurity element.

Note that the n-well between the source region 144a and the drain region 144b functions as the channel formation region 145 (see FIG. 3B).

Next, the resist 140 is removed and activation treatment is performed to activate the ion-implanted impurity elements and recover a crystal defect of the single crystal silicon substrate which is caused by the ion implantation.

The activation treatment can be performed by a rapid thermal annealing (RTA) method, a laser annealing method, or the like, for example.

Figure 3C:
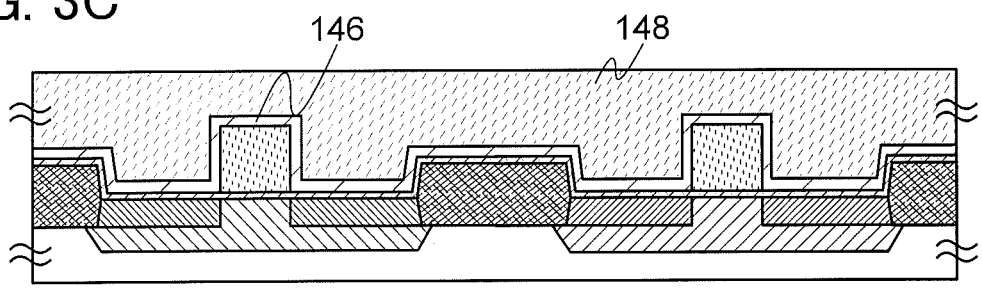

Then, the first interlayer insulating film 146 and the second interlayer insulating film 148 are formed (see FIG. 3C).

For example, as the first interlayer insulating film 146, a silicon oxide film, a silicon oxynitride film, or the like is formed by a plasma CVD method or a low-pressure CVD method.

The second interlayer insulating film 148 is formed for improving surface planarity; for example, the second interlayer insulating film 148 is formed of phosphosilicate glass (PSG), borosilicate glass (BSG), phosphoborosilicate glass (PBSG), acrylic, polyimide, or the like by a spin coating method or an atmospheric pressure CVD method.

Note that although the second interlayer insulating film is formed for improving the surface planarity in this embodiment, the present invention is not limited thereto. After the gate electrodes are formed, only the first interlayer insulating film or only the second interlayer insulating film may be formed.

Figure 3D:
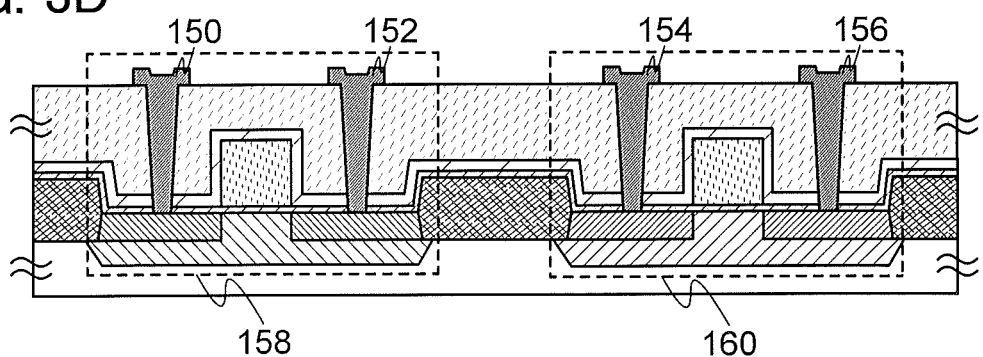

Then, contact holes (opening portions) which reach the source regions and the drain regions of the transistors are formed in the first interlayer insulating film 146 and the second interlayer insulating film 148, and the source electrode 150 and the source electrode 154 electrically connected to the source regions and the drain electrode 152 and the drain electrode 156 electrically connected to the drain regions are formed (see FIG. 3D).

The source electrodes 150 and 154 and the drain electrodes 152 and 156 can be formed in such a manner that a conductive film is formed by a PVD method, a CVD method, an evaporation method, or the like and then etched to have a desired shape. Alternatively, a conductive film can be formed selectively in predetermined locations by a droplet discharge method, a printing method, an electrolytic plating method, or the like. Furthermore, a reflow method or a damascene method can also be used. A material of the conductive film may be a metal such as Ag, Au, Cu, Ni, Pt, Pd, Ir, Rh, W, Al, Ta, Mo, Cd, Zn, Fe, Ti, Zr, Ba, or the like, Si, Ge, or an alloy thereof, or a nitride thereof. In addition, a stacked-layer structure of such materials may also be used.

Although not shown, contact holes reaching the gate electrodes 126 and 128 are formed in the first interlayer insulating film 146, and an electrode which is electrically connected to a wiring formed over the first interlayer insulating film 146 is provided.

Note that in FIG. 3D, a region surrounded by the left dashed line is the n-channel FET 158 and a region surrounded by the right dashed line is the p-channel FET 160.

Further, although the CMOS element is formed in a single layer in this embodiment, the CMOS elements can be stacked in a plurality of layers by performing the series of steps described in this embodiment plural times with a step of forming an interlayer film performed between the series.

Through the above steps, a CMOS element in which an insulating film containing gallium oxide and having a relative permittivity of 10 or more is used as a gate insulating film can be formed with the use of a single crystal semiconductor substrate.

An insulating film containing gallium oxide and having a relative permittivity of 10 or more is used as a gate insulating film; thus, even when the gate electrodes are miniaturized for miniaturization of the CMOS element, necessary capacitance for operation of the CMOS element, in which the thickness of the gate insulating film is larger than that in the case of using a silicon oxide based gate insulating film, can be secured. Therefore, a CMOS element in which leakage current between a gate electrode and a channel formation region is suppressed can be formed.

In other words, a CMOS element can be miniaturized with leakage current between a gate electrode and a channel formation region suppressed.

Thus, when a semiconductor device is manufactured including a single crystal semiconductor substrate and an insulating film containing gallium oxide and having a relative permittivity of 10 or more as a gate insulating film which are described in this embodiment, the semiconductor device can be downsized and leakage current therein can be reduced; accordingly, a downsized and high-performance semiconductor device can be provided.

(Embodiment 2)

In this embodiment, a structure and a manufacturing method of a semiconductor device which includes a semiconductor element according to one embodiment of the disclosed invention will be described with reference to FIG. 4, FIGS. 5A to 5E, FIGS. 6A to 6E, and FIGS. 7A to 7D.

Specifically, as an example of a semiconductor element according to one embodiment of the present invention, a field effect transistor in which an insulating film containing gallium oxide and having a relative permittivity of 10 or more is used as a gate insulating film is described. More specifically, a semiconductor device in which a plurality of the semiconductor elements is provided over one substrate is described.

<Example of Structure of Semiconductor Device>

Figure 4:
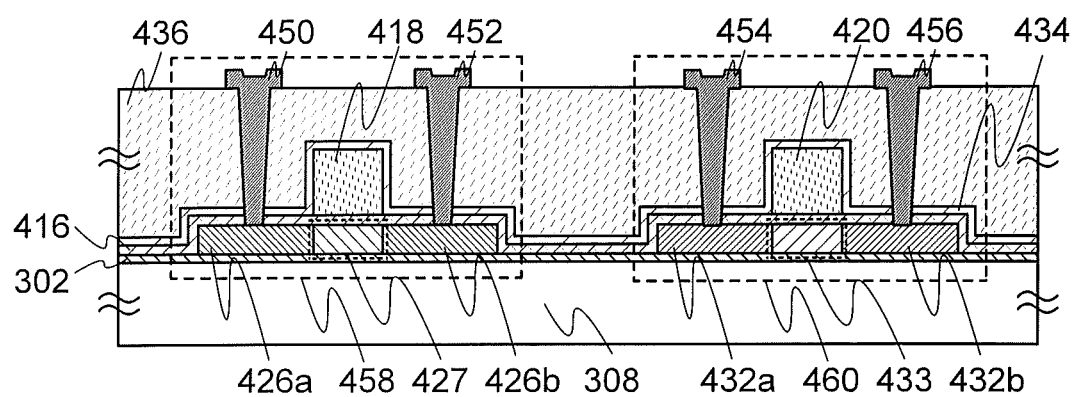
FIG. 4 is a diagram illustrating an embodiment of a semiconductor device.

As an example of a structure of a semiconductor device according to one embodiment of the disclosed invention, a top-gate CMOS element including an n-channel FET and a p-channel FET which is formed using a semiconductor substrate in which a single crystal semiconductor layer is formed over a single crystal semiconductor substrate with an insulating layer provided therebetween is illustrated in FIG. 4.

In the CMOS element illustrated in FIG. 4, an n-channel FET 458 and a p-channel FET 460 which are adjacent to each other and separated from each other by a process such as etching are formed. In each of the FETs, a single crystal semiconductor layer including a source region, a drain region, and a channel formation region is formed over a single crystal semiconductor substrate that is a base substrate with an insulating film provided therebetween.

The n-channel FET 458 in FIG. 4 has the following structure: a base substrate 308 is provided with a single crystal semiconductor layer with an insulating film 302 provided therebetween; the single crystal semiconductor layer includes a source region 426a, a drain region 426b, and a channel formation region 427; a gate insulating film 416 containing gallium oxide is formed over the base substrate 308; a gate electrode 418 is formed in a region overlapping with the channel formation region 427 with the gate insulating film 416 containing gallium oxide provided therebetween; a first interlayer insulating film 434 and a second interlayer insulating film 436 are formed over the gate electrode 418 and the gate insulating film 416 containing gallium oxide; and a source electrode 450 and a drain electrode 452 are formed so as to be electrically connected to the source region 426a and the drain region 426b, respectively, through opening portions provided in the gate insulating film 416 containing gallium oxide, the first interlayer insulating film 434, and the second interlayer insulating film 436.

The p-channel FET 460 in FIG. 4 has the following structure: the base substrate 308 is provided with a single crystal semiconductor layer with the insulating film 302 provided therebetween; the single crystal semiconductor layer includes a source-region 432a, a drain region 432b, and a channel formation region 433; the gate insulating film 416 containing gallium oxide is formed over the base substrate 308; a gate electrode 420 is formed in a region overlapping with the channel formation region 433 with the gate insulating film 416 containing gallium oxide provided therebetween; the first interlayer insulating film 434 and the second interlayer insulating film 436 are formed over the gate electrode 420 and the gate insulating film 416 containing gallium oxide; and a source electrode 454 and a drain electrode 456 are formed so as to be electrically connected to the source region 432a and the drain region 432b, respectively, through opening portions provided in the gate insulating film 416 containing gallium oxide, the first interlayer insulating film 434, and the second interlayer insulating film 436.

Although the gate insulating film 416 is illustrated as having a single-layer structure in FIG. 4, the gate insulating film 416 may have a stacked-layer structure including a plurality of layers.

Although the gate electrodes 418 and 420 are each illustrated as having a single-layer structure in FIG. 4, each of them may have a stacked-layer structure including a plurality of layers.

Although the interlayer film over the gate electrodes is illustrated as having a stacked-layer structure including the first interlayer insulating film and the second interlayer insulating film in FIG. 4, the interlayer film may have a single-layer structure.

Since the n-channel and p-channel FETs in the example of this embodiment include an insulating film containing gallium oxide and having a relative permittivity of 10 or more as the gate insulating film, necessary capacitance for operation of the semiconductor element can be secured even when the thickness of the gate insulating film is increased. As a result, in each of the FETs, the gate electrode can be miniaturized with leakage current between the gate electrode and the channel formation region suppressed, whereby downsized FETs can be provided.

Further, since an ultrathin single crystal semiconductor layer can be used in the semiconductor element, the semiconductor element can be microfabricated and a downsized FET can be provided.

In addition, since semiconductor elements can be separated from each other with a miniature distance therebetween, highly integrated FETs can be provided.

In this manner, by providing downsized and highly integrated FETs over one substrate, a downsized CMOS element can be provided.

<Manufacturing Method of Semiconductor Device>

First, a substrate formed from a single crystal semiconductor substrate is prepared. By a known technique such as a Smart Cut® method, a separation by implanted oxygen (SIMOX)® method, or an epitaxial layer transfer (ELTRAN)® method, a semiconductor substrate is formed in which a single crystal semiconductor layer is formed over a base substrate with an insulating film provided therebetween.

In this embodiment, a method of manufacturing a semiconductor substrate by a Smart Cut® method, which is one of the above-described known techniques, is specifically described.

Figure 5A:
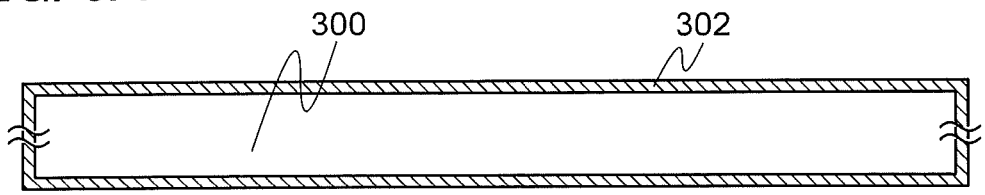
FIGS. 5A to 5E are diagrams illustrating an embodiment of a semiconductor device.
Figure 5B:
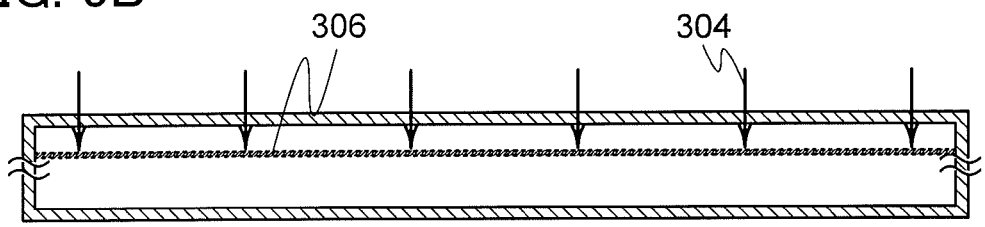

First, the insulating film 302 is formed on a surface of a single crystal semiconductor substrate 300 (see FIG. 5A). Note that, from a point of view of contaminant removal, it is preferable that the single crystal semiconductor substrate 300 be cleaned with hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like before forming the insulating film 302. Dilute hydrofluoric acid and ozone water may be discharged alternately for cleaning.

The insulating film 302 can be formed to have a single-layer structure or a stacked-layer structure including a silicon oxide film, a silicon oxynitride film, or the like. As a formation method of the insulating film 302, a thermal oxidation method, a CVD method, a sputtering method, or the like can be used. When the insulating film 302 is formed by a CVD method, a silicon oxide film is preferably formed using organosilane such as tetraethoxysilane (abbreviation: TEOS, chemical formula: $Si(OC_2H_5)_4$).

In this embodiment, a method is described in which a silicon oxide film is formed as the insulating film 302 on the surface of the single crystal semiconductor substrate 300 by performing thermal oxidation treatment. As the single crystal semiconductor substrate 300, a single crystal silicon substrate is used.

For example, by performing thermal oxidation treatment on the single crystal semiconductor substrate 300 in an oxidizing atmosphere to which chlorine (Cl) is added, the insulating film 302 is formed through chlorine oxidation. In this case, the insulating film 302 contains chlorine atoms. By such chlorine oxidation, a heavy metal (e.g., Fe, Cr, Ni, or Mo) that is an extrinsic impurity is trapped and a chloride of the metal is formed and then removed to the outside; thus, contamination of the single crystal semiconductor substrate 300 can be reduced. Moreover, after the single crystal semiconductor substrate 300 is bonded to the base substrate, an impurity (e.g., sodium) from the base substrate can be fixed in the insulating film 302, so that contamination of the single crystal semiconductor substrate 300 can be prevented.

Note that halogen atoms contained in the insulating film 302 are not limited to chlorine atoms. Fluorine atoms may be contained in the insulating film 302. As a method for fluorine oxidation of the surface of the single crystal semiconductor substrate 300, a method in which the single crystal semiconductor substrate 300 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Then, ion irradiation 304 is performed on one surface of the single crystal semiconductor substrate 300. By accelerating ions by an electric field and emitting them to the single crystal semiconductor substrate 300, an embrittled region 306 in which a cleavage surface is to be formed by heat treatment is formed at a predetermined depth of the single crystal semiconductor substrate 300 (see FIG. 5B).

As ion species with which the one surface of the single crystal semiconductor substrate is irradiated, hydrogen ions and rare gas ions are desirably used.

The depth at which the embrittled region 306 is formed can be controlled by the kinetic energy, mass, charge, or incidence angle of the ions, or the like. The embrittled region 306 is formed at approximately the same depth as the average penetration depth of the ions. Therefore, the thickness of a single crystal semiconductor layer that is to be separated from the single crystal semiconductor substrate 300 can be controlled by the depth to which the ions are emitted. For example, the average penetration depth may be controlled so that the thickness of a single crystal semiconductor layer is approximately greater than or equal to 10 nm and less than or equal to 500 nm, preferably greater than or equal to 50 nm and less than or equal to 200 nm.

The above-described ion irradiation treatment can be performed using an ion-doping apparatus, for example. An ion-doping apparatus is a non-mass-separation apparatus in which an object is irradiated with all ion species which are generated by plasma excitation of a process gas and can perform ion irradiation treatment on a large-sized object.

In this embodiment, an example is described in which the single crystal semiconductor substrate 300 is irradiated with hydrogen ions using the ion-doping apparatus. A gas containing hydrogen is used as a source gas. As for ions used for the irradiation, the proportion of $H_3^+$ is preferably set high. Specifically, it is preferable that the proportion of $H_3^+$ be set to 50% or higher (more preferably, 80% or higher) with respect to the total amount of $H^+$, $H_2^+$, and $H_3^+$. With a high proportion of $H_3^+$, the efficiency of ion irradiation can be improved.

When hydrogen is used as a source gas, an embrittled region can be formed by performing irradiation with acceleration voltage in a range of 10 kV to 100 kV, and a dose in a range of $1\times10^{15}$ ions/cm$^2$ to $5\times10^{16}$ ions/cm$^2$.

Note that although there is concern that a heavy metal may also be added by using an ion-doping apparatus in ion irradiation, by performing ion irradiation through the insulating film 302 containing halogen atoms, contamination of the single crystal semiconductor substrate 300 by such a heavy metal can be prevented.

Also, heat treatment for recovering a crystal defect may be performed after the hydrogen ion irradiation. This heat treatment is performed at a temperature at which a cleavage phenomenon due to hydrogen concentration in the embrittled region 306 does not occur (for example, 200° C. or higher and lower than 400° C.). The heat treatment can be performed using a diffusion furnace, a heating furnace such as a resistance heating furnace, a rapid thermal annealing (RTA) apparatus, a microwave heating apparatus, or the like. The above temperature condition is merely an example, and one embodiment of the disclosed invention should not be construed as being limited to this example.

Further, a crystal defect in the single crystal semiconductor substrate may be recovered after the hydrogen ion irradiation, by emitting laser light to the one surface of the single crystal semiconductor substrate to selectively melt an irradiated region of the single crystal semiconductor substrate in a depth direction as well and to re-single-crystallize the single crystal semiconductor substrate.

Then, the base substrate 308 over which the single crystal semiconductor layer and the insulating film 302 are to be transferred is prepared. The single crystal semiconductor layer and the insulating film 302 exist on a side of a cleavage surface 310 which is closer to the one surface of the single crystal semiconductor substrate. The cleavage surface 310 here is to be formed in the embrittled region 306 in a later step.

As the base substrate 308, a single crystal semiconductor substrate such as a silicon (Si) substrate, a gallium arsenide (GaAs) substrate, or an indium phosphide (InP) substrate can be used.

When a single crystal semiconductor substrate is used as the base substrate, high-temperature heat treatment can be performed in a later step.

In addition, when a single crystal semiconductor substrate is used as the base substrate, high-accuracy treatment such as exposure treatment for forming a miniature shape with the use of a stepper can be performed in a later step.

Note that in this embodiment, a diagram in which a single crystal silicon substrate is used as the base substrate 308 is referred to.

A surface of the base substrate 308 is preferably cleaned. Specifically, the base substrate 308 is subjected to ultrasonic cleaning with a hydrochloric acid/hydrogen peroxide mixture (HPM), a sulfuric acid/hydrogen peroxide mixture (SPM), an ammonium hydrogen peroxide mixture (APM), diluted hydrofluoric acid (DHF), FPM (a mixed solution of hydrofluoric acid, hydrogen peroxide water, and pure water), or the like. Through such cleaning treatment, the surface planarity of the base substrate 308 can be improved and abrasive particles left on the surface of the base substrate 308 can be removed.

Figure 5C:
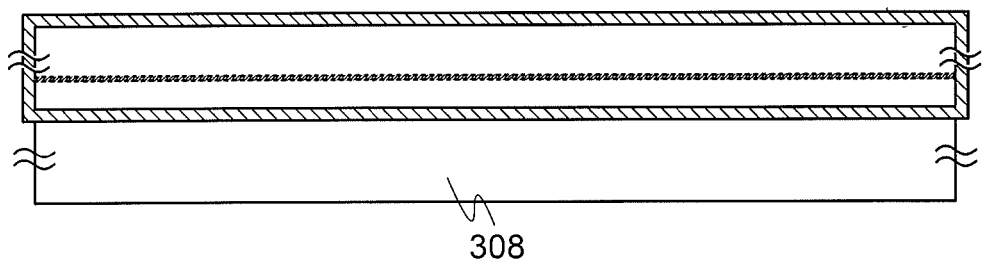

After that, the one surface of the single crystal semiconductor substrate 300 and the base substrate 308 are bonded to each other (see FIG. 5C).

Note that before bonding the one surface of the single crystal semiconductor substrate 300 and the base substrate 308 to each other, the one surface of the single crystal semiconductor substrate 300 and a bonding surface of the base substrate 308 are preferably subjected to surface treatment. The surface treatment can strengthen the bonding strength between the one surface of the single crystal semiconductor substrate 300 and the bonding surface of the base substrate 308.

As the surface treatment, wet treatment, dry treatment, or a combination of wet treatment and dry treatment can be used. Alternatively, wet treatment may be used in combination with different wet treatment or dry treatment may be used in combination with different dry treatment.

Figure 5D:
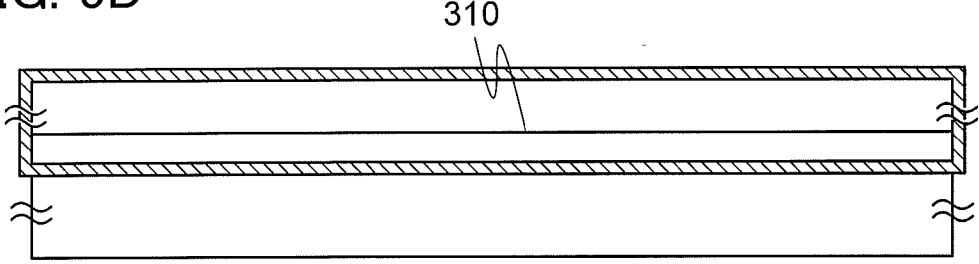

Then, the bonded single crystal semiconductor substrate 300 and the base substrate 308 are subjected to heat treatment, whereby volume expansion is led by hydrogen concentration at the embrittled region 306 in the single crystal semiconductor substrate 300 and the cleavage surface 310 is formed (see FIG. 5D).

Note that the heat treatment for forming the cleavage surface 310 is performed at a temperature which does not exceed the strain point of the base substrate 308. The heat treatment can be performed using a diffusion furnace, a heating furnace such as a resistance heating furnace, a rapid thermal annealing (RTA) apparatus, a microwave heating apparatus, or the like. The above temperature condition is merely an example, and one embodiment of the disclosed invention should not be construed as being limited to this example.

After that, the single crystal semiconductor substrate 300 is separated from the base substrate 308. Accordingly, a semiconductor substrate 314 having the cleavage surface 310 as a boundary, in which a single crystal semiconductor layer 312 is transferred over the base substrate 308 with the insulating film 302 provided therebetween can be obtained (see FIG. 5E).

The thickness of the single crystal semiconductor layer 312 which is formed by the above-described method can be controlled by an ion implantation depth, whereby an extremely thin single crystal semiconductor layer can be formed. When the single crystal semiconductor layer is thin, the single crystal semiconductor layer can be divided into a plurality of layers by a processing method such as etching in an extremely short time. Therefore, microfabrication of the single crystal semiconductor layer 312 is possible and a downsized FET can be provided.

Figure 5E:
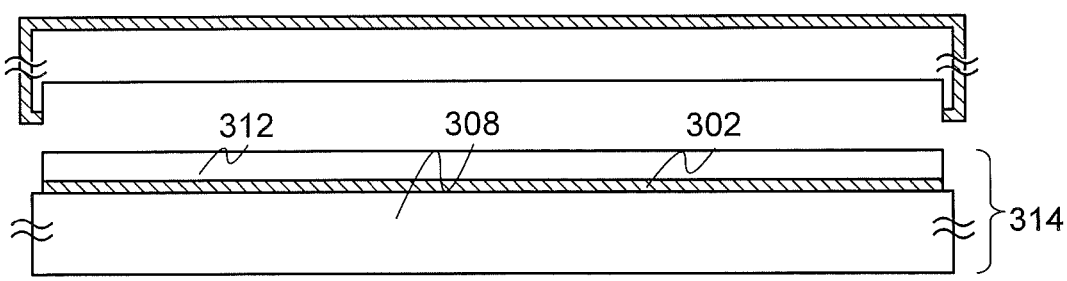

Note that in this embodiment, a single crystal silicon substrate is used as the base substrate 308 in the description and the base substrate 308 and the single crystal semiconductor layer 312 in FIG. 5E are not separated by color; however, the base substrate 308 and the single crystal semiconductor layer 312 are not necessarily formed using the same material.

Figure 6A:
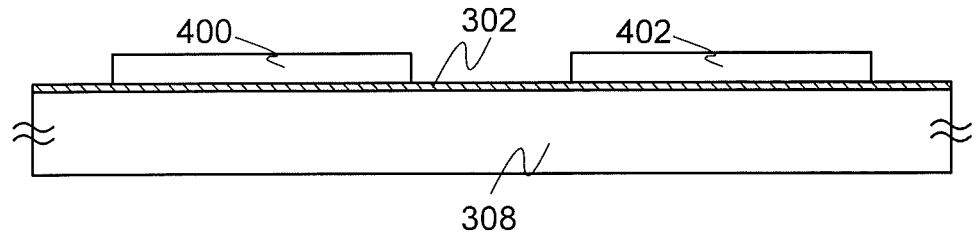
FIGS. 6A to 6E are diagrams illustrating an embodiment of a semiconductor device.

Then, a resist mask is formed over the single crystal semiconductor layer 312 of the semiconductor substrate 314 with the use of a photomask and the single crystal semiconductor layer 312 is etched, so that a single crystal semiconductor layer 400 and a single crystal semiconductor layer 402 which are separated to have island shapes and correspond to the arrangement of semiconductor elements are formed (see FIG. 6A).

By using the semiconductor substrate 314 in which the single crystal semiconductor layer 312 is formed over the base substrate 308 with the insulating film 302 provided therebetween, the single crystal semiconductor layer 400 serving as a semiconductor layer of an n-channel MOSFET and the single crystal semiconductor layer 402 serving as a semiconductor layer of an p-channel MOSFET can be completely separated by a processing method such as etching. Therefore, a space between the n-channel FET and the p-channel FET can be reduced, which enables highly integrated FETs to be formed.

Figure 6B:
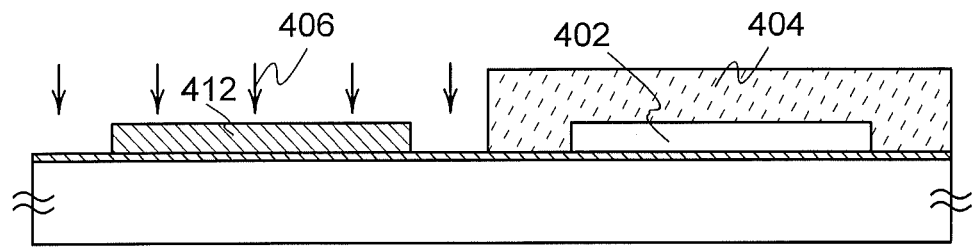
Figure 6C:
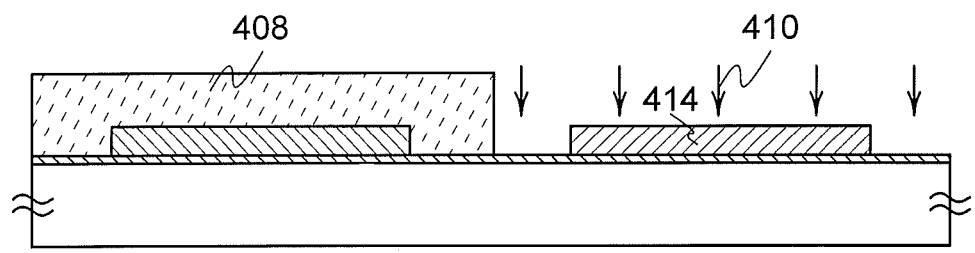

Then, the single crystal semiconductor layer 402 where the p-channel FET is formed later is covered with a resist 404 and an impurity element 406 imparting p-type conductivity is added to the single crystal semiconductor layer 400 where the n-channel FET is formed later; thus, a first impurity region 412 is formed (see FIG. 6B).

In this embodiment, boron (B) is used as the impurity element imparting p-type conductivity and diborane ($B_2H_6$) is used as a doping gas containing the impurity element.

After that, the resist 404 is removed. Then, the first impurity region 412 is covered with a resist 408 and an impurity element 410 imparting n-type conductivity is added to the single crystal semiconductor layer 402 where the p-channel FET is formed later; thus, a second impurity region 414 is formed (see FIG. 6C).

In this embodiment, phosphorus (P) is used as the impurity element imparting n-type conductivity and phosphine ($PH_3$) is used as a doping gas containing the impurity element.

Figure 6D:
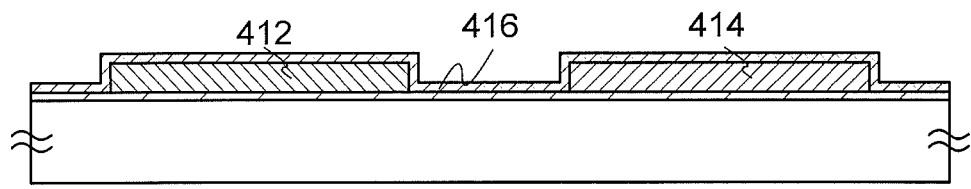
Figure 6E:
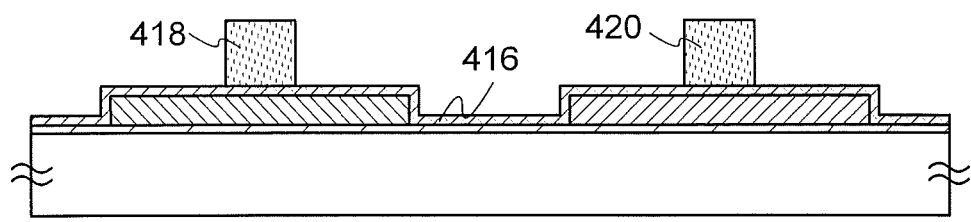

Then, the resist 408 is removed and the gate insulating film 416 containing gallium oxide and having a relative permittivity of 10 or more is formed so as to cover the first impurity region 412 and the second impurity region 414 similarly to Embodiment 1 (see FIG. 6D).

Note that when the thickness of the gate insulating film 416 containing gallium oxide is too small, leakage current which adversely affects operation of the semiconductor element occurs; on the other hand, when the thickness of the gate insulating film 416 containing gallium oxide is too large, a large number of carriers enough to operate the semiconductor element does not flow. The thickness of the gate insulating film 416 is preferably greater than or equal to 1 nm and less than or equal to 50 nm, further preferably greater than or equal to 1 nm and less than or equal to 20 nm.

Note that, in the gallium oxide film which is formed as a gate insulating film by the formation method described in this embodiment, a substance other than gallium and oxygen may be contained. For example, a gallium oxide film containing an element such as silicon (Si), germanium (Ge), tin (Sn), aluminum (Al), or indium (In) or a gallium oxide film containing a gas component such as Ar which is used at the time of depositing gallium oxide may be formed.

Further, although the gate insulating film in this embodiment has a single-layer structure, the gate insulating film may have a stacked-layer structure in which a thin insulating film such as a thin silicon oxide film is formed at one or both of an interface between the channel formation region and the gate insulating film and an interface between the gate insulating film and the gate electrode.

Then, a polysilicon layer is formed over an entire surface of the substrate and is shaped into a predetermined form by a lithography technique and a dry etching technique. By this treatment, the gate electrode 418 and the gate electrode 420 are formed over the gate insulating film 416 containing gallium oxide (see FIG. 6E).

Note that the gate electrode 418 and the gate electrode 420 may be doped with an n-type impurity such as phosphorus (P) for a reduction in resistance. It may be at the time of formation of the polysilicon layer that an n-type impurity such as phosphorus is added.

In this embodiment, an example in which a gate electrode formed from the polysilicon layer having a single-layer structure is used is described; however, the present invention is not limited thereto and the gate electrode may have a single-layer structure of a silicide layer or a polycide structure in which a polysilicon layer and a silicide layer are stacked. Alternatively, the gate electrode may have a single-layer structure or a stacked-layer structure of metal or a material whose main component is metal.

Figure 7A:
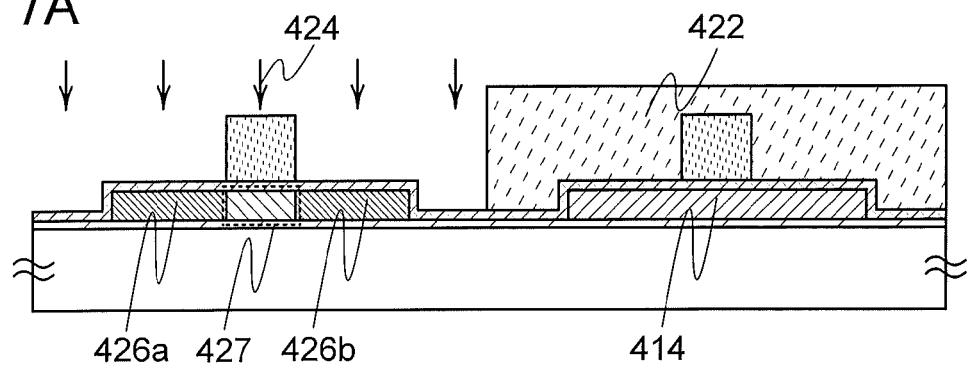
FIGS. 7A to 7D are diagrams illustrating an embodiment of a semiconductor device.

After that, a region including the second impurity region 414 where the p-channel FET is formed is covered with a resist 422 and an impurity element 424 imparting n-type conductivity is added to the first impurity region 412; thus, the source region 426a and the drain region 426b are formed (see FIG. 7A).

In this embodiment, phosphorus (P) is used as the impurity element imparting n-type conductivity and $PH_3$ is used as a doping gas containing the impurity element.

Note that the first impurity region 412 between the source region 426a and the drain region 426b functions as the channel formation region 427 (see FIG. 7A):

Subsequently, the resist 422 is removed. A region where the source region 426a, the drain region 426b, and the channel formation region 427 that are included in the n-channel FET are formed is covered with a resist 428. An impurity element 430 imparting p-type conductivity is added to a region where the second impurity region 414 is formed; thus, the source region 432a and the drain region 432b are formed (see FIG. 7B).

In this embodiment, boron (B) is used as the impurity element imparting p-type conductivity and diborane ($B_2H_6$) is used as a doping gas containing the impurity element.

Figure 7B:
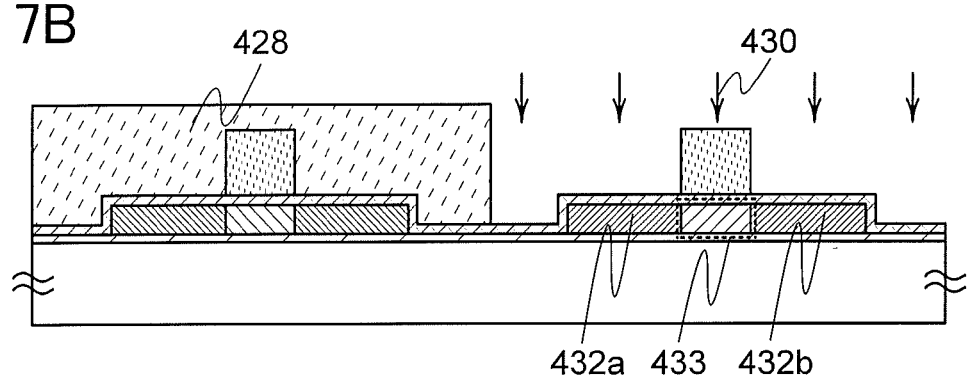

Note that the second impurity region 414 between the source region 432a and the drain region 432b functions as the channel formation region 433 (see FIG. 7B).

Next, the resist 428 is removed and activation treatment is performed to activate the ion-implanted impurity elements and recover a crystal defect of the single crystal silicon substrate which is caused by the ion implantation.

The activation treatment can be performed by a rapid thermal annealing (RTA) method, a laser annealing method, or the like, for example.

Figure 7C:
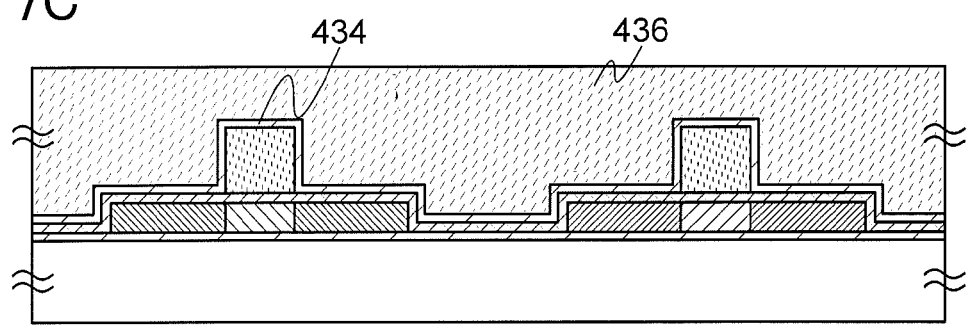

Then, the first interlayer insulating film 434 and the second interlayer insulating film 436 are formed (see FIG. 7C).

For example, as the first interlayer insulating film 434, a silicon oxide film, a silicon oxynitride film, or the like is formed by a plasma CVD method or a low-pressure CVD method.

The second interlayer insulating film 436 is formed for improving surface planarity; for example, the second interlayer insulating film 436 is formed of phosphosilicate glass (PSG), borosilicate glass (BSG), phosphoborosilicate glass (PBSG), acrylic, polyimide, or the like by a spin coating method or an atmospheric pressure CVD method.

Note that although the second interlayer insulating film is formed for improving the surface planarity in this embodiment; the present invention is not limited thereto. After the gate electrodes are formed, only the first interlayer insulating film or only the second interlayer insulating film may be formed.

Figure 7D:
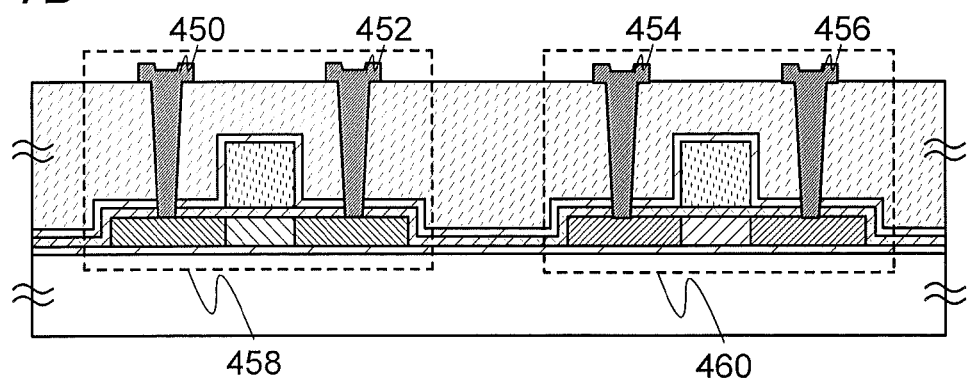

After that, in the first interlayer insulating film 434 and the second interlayer insulating film 436, contact holes reaching the source regions and the drain regions of the transistors are formed; then, the source electrodes 450 and 454 and the drain electrodes 452 and 456 are formed (see FIG. 7D).

The source electrodes 450 and 454 and the drain electrodes 452 and 456 can be formed in such a manner that, for example, a conductive film is formed by a PVD method, a CVD method, an evaporation method, or the like and then etched to have a desired shape. Alternatively, a conductive film can be formed selectively in predetermined locations by a droplet discharge method, a printing method, an electrolytic plating method, or the like. Furthermore, a reflow method or a damascene method can also be used. A material of the conductive film may be a metal such as Ag, Au, Cu, Ni, Pt, Pd, Ir, Rh, W, Al, Ta, Mo, Cd, Zn, Fe, Ti, Zr, Ba, or the like, Si, Ge, or an alloy thereof, or a nitride thereof. In addition, a stacked-layer structure of such materials may also be used.

Although not shown, contact holes reaching the gate electrodes 418 and 420 are formed in the first interlayer insulating film 434, and an electrode which is electrically connected to a wiring formed over the first interlayer insulating film 434 is provided.

Note that in FIG. 7D, a region surrounded by the left dashed line is the n-channel FET 458 and a region surrounded by the right dashed line is the p-channel FET 460.

Through the above steps, a CMOS element in which an insulating film containing gallium oxide and having a relative permittivity of 10 or more is used as a gate insulating film can be formed over a semiconductor substrate in which a single crystal semiconductor layer is formed over a base substrate with an insulating film provided therebetween.

Note that although the CMOS element is formed in a single layer in this embodiment, the CMOS elements can be stacked in a plurality of layers by performing the series of steps described in this embodiment plural times with a step of forming an interlayer film performed between the series.

(Embodiment 3)

In this embodiment, a structure and a manufacturing method of a semiconductor device which includes a semiconductor element according to one embodiment of the disclosed invention will be described with reference to FIG. 8, and FIGS. 9A and 9B.

Specifically, as an example of a semiconductor element according to one embodiment of the present invention, a field effect transistor in which an insulating film containing gallium oxide and having a relative permittivity of 10 or more is used as a gate insulating film is described. More specifically, a semiconductor device is described in which a plurality of the semiconductor elements is provided over a glass substrate, the size of which can be easily increased.

<Example of Structure of Semiconductor Device>

Figure 8:
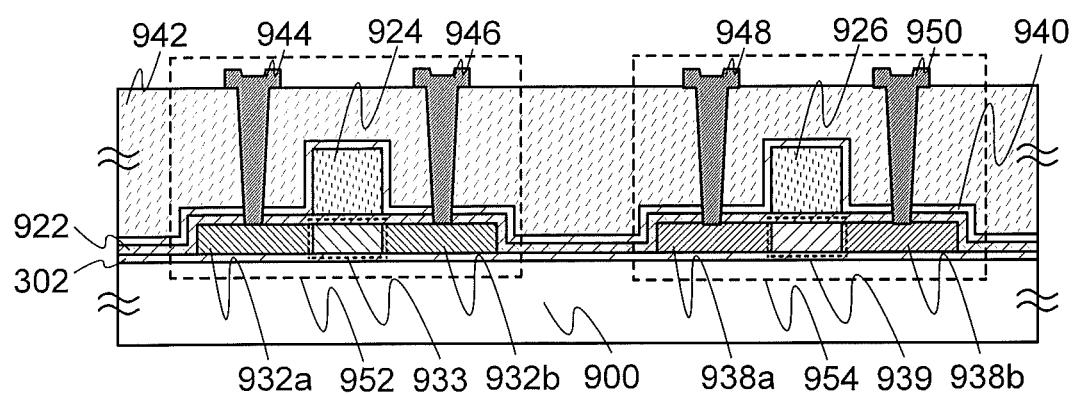
FIG. 8 is a diagram illustrating an embodiment of a semiconductor device.

As an example of a structure of a semiconductor device according to one embodiment of the disclosed invention, a top-gate CMOS element including an n-channel FET and a p-channel FET which is formed using a semiconductor substrate in which a single crystal semiconductor layer is formed over an insulating substrate with an insulating layer provided therebetween is illustrated in FIG. 8. In the structure of this embodiment described below, the same portions or portions having similar functions are denoted by the same reference numerals in different drawings, in Embodiments 2 and 3, and the description thereof is not repeated.

In the CMOS element illustrated in FIG. 8, an n-channel FET 952 and a p-channel FET 954 which are adjacent to each other and separated from each other by a process means such as etching are formed. In each of the FETs, a single crystal semiconductor layer including a source region, a drain region, and a channel formation region is formed over an insulating substrate that is a base substrate with an insulating film provided therebetween.

The n-channel FET 952 in FIG. 8 has the following structure: a base substrate 900 is provided with a single crystal semiconductor layer with the insulating film 302 provided therebetween; the single crystal semiconductor layer includes a source region 932a, a drain region 932b, and a channel formation region 933; a gate insulating film 922 containing gallium oxide is formed over the base substrate 900; a gate electrode 924 is formed in a region overlapping with the channel formation region 933 with the gate insulating film 922 containing gallium oxide provided therebetween; a first interlayer insulating film 940 and a second interlayer insulating film 942 are formed over the gate electrode 924 and the gate insulating film 922 containing gallium oxide; and a source electrode 944 and a drain electrode 946 are formed so as to be electrically connected to the source region 932a and the drain region 932b, respectively, through opening portions provided in the gate insulating film 922 containing gallium oxide, the first interlayer insulating film 940, and the second interlayer insulating film 942.

The p-channel FET 954 in FIG. 8 has the following structure: the base substrate 900 is provided with a single crystal semiconductor layer with the insulating film 302 provided therebetween; the single crystal semiconductor layer includes a source region 938a, a drain region 938b, and a channel formation region 939; the gate insulating film 922 containing gallium oxide is formed over the base substrate 900; a gate electrode 926 is formed in a region overlapping with the channel formation region 939 with the gate insulating film 922 containing gallium oxide provided therebetween; the first interlayer insulating film 940 and the second interlayer insulating film 942 are formed over the gate electrode 926 and the gate insulating film 922 containing gallium oxide; and a source electrode 948 and a drain electrode 950 are formed so as to be electrically connected to the source region 938a and the drain region 938b, respectively, through opening portions provided in the gate insulating film 922 containing gallium oxide, the first interlayer insulating film 940, and the second interlayer insulating film 942.

Although the gate insulating film 922 is illustrated as having a single-layer structure in FIG. 8, the gate insulating film 922 may have a stacked-layer structure including a plurality of layers.

Although the gate electrodes 924 and 926 are each illustrated as having a single-layer structure in FIG. 8, each of them may have a stacked-layer structure including a plurality of layers.

Although the interlayer film over the gate electrodes is illustrated as having a stacked-layer structure including the first interlayer insulating film 940 and the second interlayer insulating film 942 in FIG. 8, the interlayer film may have a single-layer structure.

Since the n-channel and p-channel FETs in the example of this embodiment include an insulating film containing gallium oxide and having a relative permittivity of 10 or more as the gate insulating film, necessary capacitance for operation of the semiconductor element can be secured even when the thickness of the gate insulating film is increased. As a result, in each of the FETs, the gate electrode can be miniaturized with leakage current between the gate electrode and the channel formation region suppressed, whereby downsized FETs can be provided.

Further, since an ultrathin single crystal semiconductor layer can be used in the semiconductor element, the semiconductor element can be microfabricated and a downsized FET can be provided.

In addition, since semiconductor elements can be separated from each other with a miniature distance therebetween, highly integrated FETs can be provided.

Besides, since a semiconductor element can be formed over a glass substrate, the size of which can be easily increased, a semiconductor element can be provided at low cost.

In this manner, by providing downsized and highly integrated FETs over one substrate, a downsized CMOS element can be provided at low cost.

<Manufacturing Method of Semiconductor Device>

In this embodiment, a manufacturing method of a CMOS element that is an example of a semiconductor device according to one embodiment of the disclosed invention is described with reference to FIGS. 9A and 9B. A semiconductor substrate in which a single crystal semiconductor layer is formed over an insulating substrate with an insulating layer provided therebetween is used in the CMOS element.

In a method described in this embodiment, a base substrate formed from an insulator is used instead of a base substrate formed from a single crystal semiconductor substrate which is used in Embodiment 2. Accordingly, description of the same portion or a portion having a similar function to the portion in Embodiment 2 is omitted.

Figure 9A:
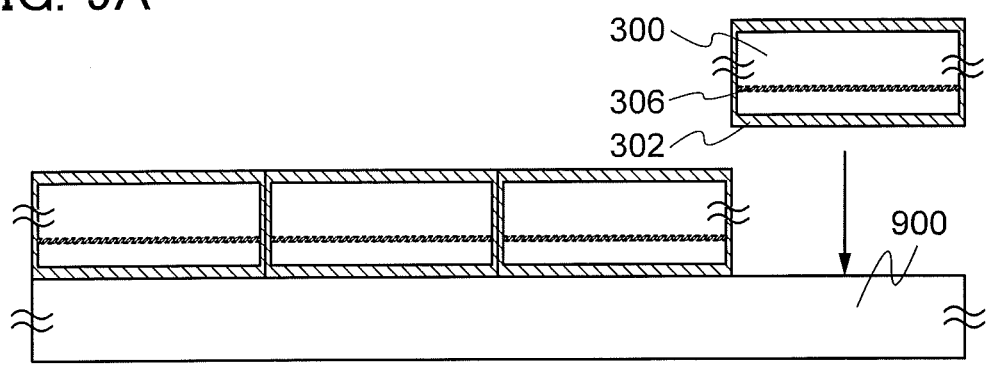
FIGS. 9A and 9B are diagrams illustrating an embodiment of a semiconductor device.

The following steps are performed similarly to Embodiment 2: first, the single crystal semiconductor substrate 300 is prepared; the insulating film 302 is formed on the surface of the single crystal semiconductor substrate 300; the embrittled region 306 is formed by performing ion implantation treatment on the single crystal semiconductor substrate; and one surface of the single crystal semiconductor substrate where the insulating film and the embrittled region are formed is bonded to the base substrate 900 (see FIG. 9A).

As the base substrate 900, a substrate formed from an insulator can be used. For example, a variety of non-alkali glass substrates such as aluminosilicate glass or aluminoborosilicate glass which are used in the electronics industry, a quartz substrate, a sapphire substrate, or the like may be used.

In FIG. 9A, the single crystal semiconductor substrates 300 where the insulating films 302 and the embrittled regions 306 are formed are bonded to the base substrate 900 with no space between the single crystal semiconductor substrates; however, bonding may be performed in such a manner that a space is formed between the single crystal semiconductor substrates. Further, the single crystal semiconductor substrate 300 where the insulating film 302 and the embrittled region 306 are formed may be bonded to only part of the base substrate 900. It is preferable that where to bond the single crystal semiconductor substrate 300 be decided according to the shape of the semiconductor device to manufacture.

Figure 9B:
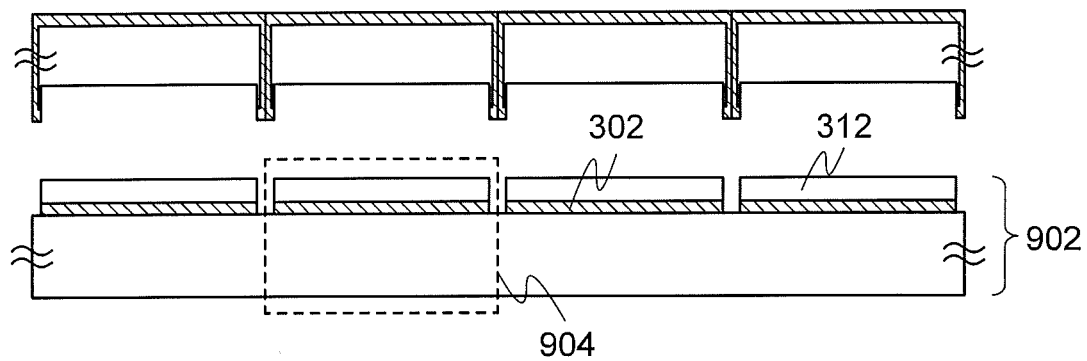

Then, heat treatment is performed on the base substrate 900 and the single crystal semiconductor substrate 300 where the insulating film 302 and the embrittled region 306 are formed, so that a cleavage surface is formed in the single crystal semiconductor substrate and the single crystal semiconductor substrate is separated from the base substrate 900; thus, a semiconductor substrate 902 in which a plurality of the single crystal semiconductor layers 312 is arranged over the base substrate 900 with the insulating films 302 provided therebetween is formed (see FIG. 9B).

The thickness of the single crystal semiconductor layer 312 which is formed by the above-described method can be controlled by an ion implantation depth, whereby an extremely thin single crystal semiconductor layer can be formed. When the single crystal semiconductor layer is thin, the single crystal semiconductor layer can be divided into a plurality of layers by a processing method such as etching in an extremely short time. Therefore, microfabrication of the single crystal semiconductor layer 312 is possible and a downsized FET can be provided.

The base substrate used in this embodiment is a substrate formed from an insulator; that is, a large-size substrate which is used in a manufacturing process of liquid crystal displays or the like can also be used as the base substrate. Therefore, as compared to the case where a single crystal semiconductor substrate is used as a base substrate, a larger number of semiconductor elements can be formed over one semiconductor substrate, and cost of a semiconductor device can be thus suppressed.

Note that in FIG. 9B, the semiconductor substrate 902 can be regarded as having a plurality of the same structures (a structure surrounded by a dashed line 904). The structure surrounded by the dashed line 904 is a structure in which the above-described base substrate 900 formed from an insulator is substituted for the base substrate 308 of the semiconductor substrate 314 which is described in Embodiment 2 with reference to FIG. 5E. Manufacturing steps subsequent to the above step in this embodiment are basically the same as those in Embodiment 2; thus, the structure of the semiconductor device illustrated in FIG. 8 may be formed by referring to FIGS. 6A to 6E and FIGS. 7A to 7D and the description made in Embodiment 2 with reference thereto for the subsequent steps. Therefore, detailed description of the subsequent steps is not made here.

Through the above steps, a CMOS element in which an insulating film containing gallium oxide and having a relative permittivity of 10 or more is used as a gate insulating film can be formed over a semiconductor substrate in which a single crystal semiconductor layer is formed over a base substrate with an insulating film provided therebetween.

(Embodiment 4)

In this embodiment, a variety of electronic appliances in which the semiconductor device described as an example in any of Embodiments 1 to 3 is used are described with reference to FIGS. 10A to 10E.

The semiconductor device manufactured with the use of the insulating film containing gallium oxide as a gate insulating film which is described in any of Embodiments 1 to 3 as an example can be applied to a variety of electronic appliances.

As those kinds of electronic appliances, cameras such as video cameras and digital cameras; displays that can be mounted on a person's head (goggle-type displays); car navigation systems; projectors; car stereos; personal computers; portable information terminals (such as mobile computers, cellular phones, and electronic books); and the like can be given. Examples thereof are illustrated in FIGS. 10A to 10E.

Furthermore, the present invention can be applied to a semiconductor device or the like provided with a calculation function that can transmit and receive data without contact, which is also called a micro processor, an RFID tag, an ID tag, an IC tag, an IC chip, an RF tag, a wireless tag, an electronic tag, or a wireless chip.

Figure 10A:
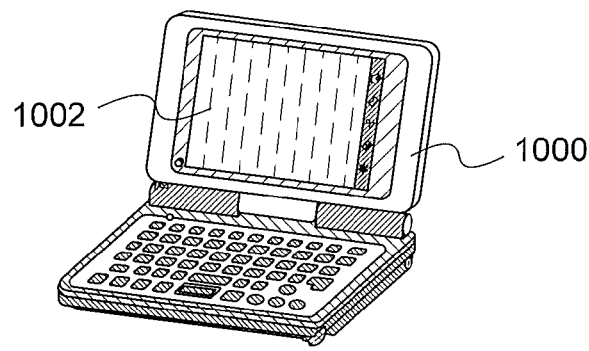
FIGS. 10A to 10E are diagrams each illustrating an electronic appliance.

A portable information terminal device illustrated in FIG. 10A includes a main body 1000, a display portion 1002, and the like. By application of the semiconductor device described in any of Embodiments 1 to 3, a high-performance and highly reliable portable information terminal device can be provided.

Figure 10B:
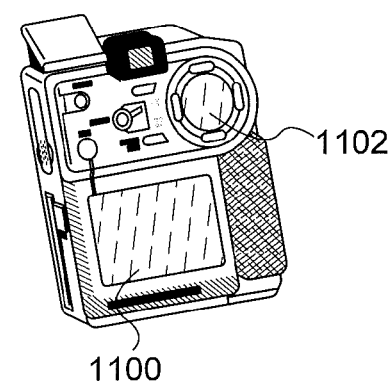

A digital video camera illustrated in FIG. 10B includes a display portion 1100, a display portion 1102, and the like. By application of the semiconductor device described in any of Embodiments 1 to 3, a high-performance and highly reliable digital video camera can be provided.

Figure 10C:
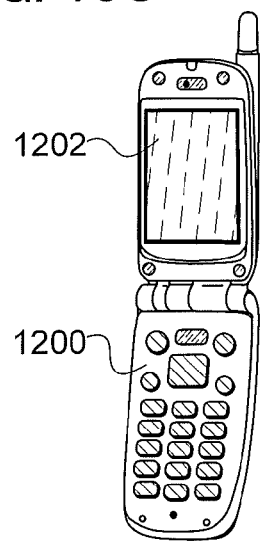

A cellular phone illustrated in FIG. 10C includes a main body 1200, a display portion 1202, and the like. By application of the semiconductor device described in any of Embodiments 1 to 3, a high-performance and highly reliable cellular phone can be provided.

Figure 10D:
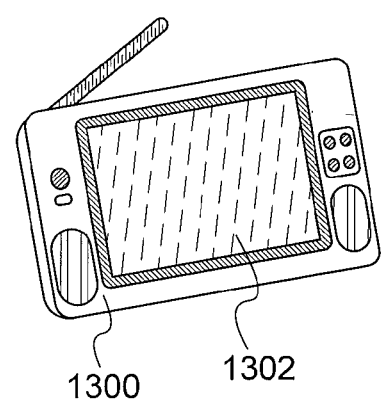

A portable television device illustrated in FIG. 10D includes a main body 1300, a display portion 1302, and the like. By application of the semiconductor device described in any of Embodiments 1 to 3, a high-performance and highly reliable portable television device can be provided. The semiconductor device of the present invention can be applied widely to various types of television devices including small-sized television incorporated in a portable terminal such as a cellular phone, a medium-sized television that can be carried around, and a large-sized television (for example, 40 inches or larger).

Figure 10E:
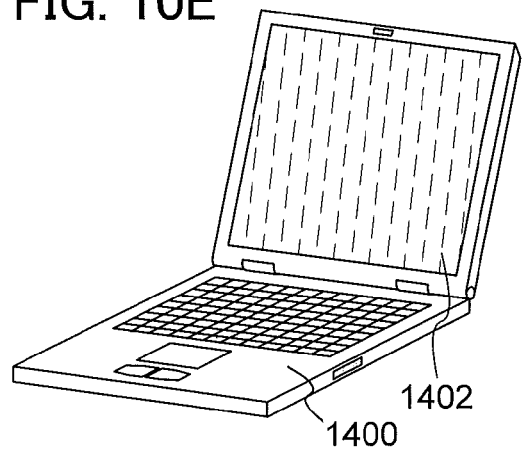

A mobile computer illustrated in FIG. 10E includes a main body 1400, a display portion 1402, and the like. By application of the semiconductor device described in any of Embodiments 1 to 3, a high-performance and highly reliable mobile computer can be provided.

As described above, an electronic appliance can be downsized and have higher performance when including the semiconductor device manufactured with the use of the insulating film containing gallium oxide as the gate insulating film which is described in any of Embodiments 1 to 3 as an example.

Further, since an electronic appliance in which the semiconductor device described in Embodiment 3 as an example is used can be manufactured at low cost, the electronic device can be downsized, have higher performance, and be provided at low cost.

This application is based on Japanese Patent Application serial no. 2010-117831 filed with Japan Patent Office on May 21, 2010, the entire contents of which are hereby incorporated by reference.

What is claimed is:

1. A semiconductor element comprising:
   a single crystal semiconductor layer over a substrate, the single crystal semiconductor layer comprising a channel formation region between a source region and a drain region;
   a gate insulating film over the channel formation region;
   a gate electrode overlapping with the channel formation region and being in direct contact with the gate insulating film;
   a source electrode electrically connected to the source region through a first opening portion formed in the gate insulating film; and
   a drain electrode electrically connected to the drain region through a second opening portion formed in the gate insulating film,
   wherein the gate insulating film is a stacked-layer film comprising a first insulating film comprising silicon and oxygen, a second insulating film comprising silicon and oxygen, and a film comprising gallium and oxygen between the first insulating film and the second insulating film,
   wherein a concentration of gallium is 35 at. % to 50 at. % and a concentration of oxygen is 50 at. % to 65 at. % in the film comprising gallium and oxygen,
   wherein the film comprising gallium and oxygen has a relative permittivity of 10 or more, and
   wherein a total thickness of the gate insulating film between the gate electrode and the single crystal semiconductor layer is greater than or equal to 1 nm and less than or equal to 20 nm.

2. The semiconductor element according to claim 1, wherein the substrate is an insulating substrate.

3. A semiconductor device comprising the semiconductor element according to claim 1.

4. The semiconductor element according to claim 1, wherein a total atomic percentage of gallium and oxygen is 100 at. %.

5. The semiconductor element according to claim 1, wherein the film comprising gallium and oxygen further comprises any one of silicon, germanium, tin, aluminum, and indium.

6. A semiconductor element comprising:
   a single crystal semiconductor comprising a channel formation region between a source region and a drain region;
   a gate insulating film over the channel formation region;
   a gate electrode overlapping with the channel formation region and being in contact with the gate insulating film;
   a source electrode electrically connected to the source region through a first opening portion formed in the gate insulating film; and
   a drain electrode electrically connected to the drain region through a second opening portion formed in the gate insulating film,
   wherein the gate insulating film is a stacked-layer film comprising a first insulating film comprising silicon and oxygen, a second insulating film comprising silicon and oxygen, and a film comprising gallium and oxygen between the first insulating film and the second insulating film,
   wherein a concentration of gallium is 35 at. % to 50 at. % and a concentration of oxygen is 50 at. % to 65 at. % in the film comprising gallium and oxygen,
   wherein the film comprising gallium and oxygen has a relative permittivity of 10 or more, and
   wherein a total thickness of the gate insulating film between the gate electrode and the single crystal semiconductor is greater than or equal to 1 nm and less than or equal to 20 nm.

7. The semiconductor element according to claim 6, wherein a total atomic percentage of gallium and oxygen is 100 at. %.

8. The semiconductor element according to claim 6, wherein the film comprising gallium and oxygen further comprises any one of silicon, germanium, tin, aluminum, and indium.

* * * * *